Figure 1:
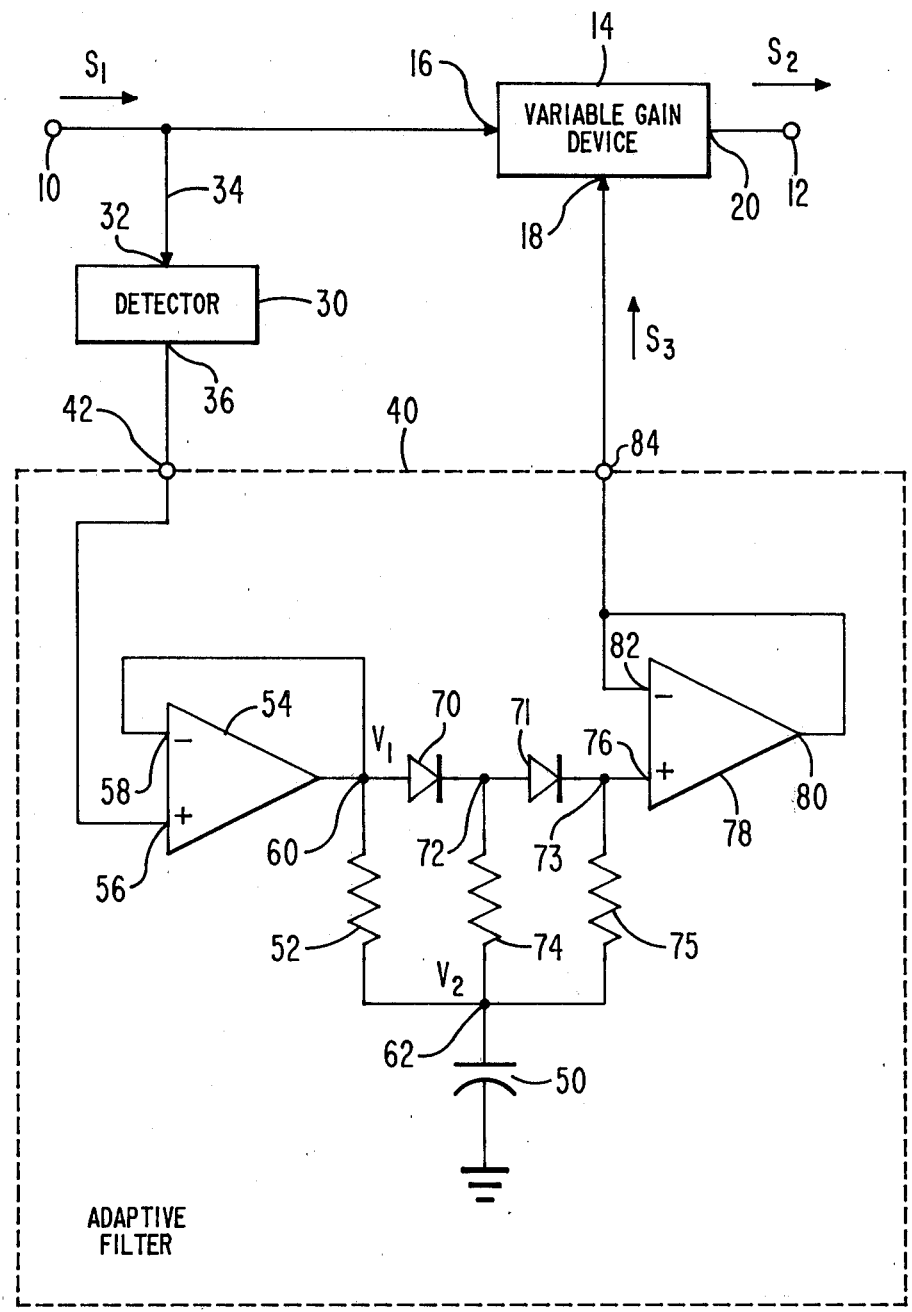

United States Patent [19]

Dieterich

[11] 4,398,157
[45] Aug. 9, 1983

[54] SIGNAL EXPANDER/COMPRESSOR WITH ADAPTIVE CONTROL CIRCUIT

[75] Inventor: Charles B. Dieterich, Princeton, N.J.

[73] Assignee: RCA Corporation, New York, N.Y.

[21] Appl. No.: 258,432

[22] Filed: Apr. 28, 1981

Related U.S. Application Data

[63] Continuation-in-part of Ser. No. 229,518, Jan. 29, 1981, abandoned.

[51] Int. Cl.³ .............................................. H03G 7/06
[52] U.S. Cl. ..................................... 330/86; 330/136; 330/141; 330/281; 333/14
[58] Field of Search ................. 330/86, 136, 134, 141, 330/281, 282; 333/14; 455/244

[56] References Cited

U.S. PATENT DOCUMENTS

| | | | |
|---|---|---|---|
| 3,732,371 | 5/1973 | Burwen | 179/1 R |
| 3,980,964 | 9/1976 | Grodinsky | 330/278 |
| 4,024,463 | 5/1977 | Pelley | 330/138 |
| 4,114,115 | 9/1978 | Minnis | 330/86 X |
| 4,220,929 | 9/1980 | Talbot et al. | 330/136 |
| 4,307,348 | 12/1981 | Nicholson | 330/134 |

OTHER PUBLICATIONS

Pickering, "High Fidelity Volume Expander", Audio Engineering, Sep. 1947, pp. 122–124.

Primary Examiner—James B. Mullins
Attorney, Agent, or Firm—E. M. Whitacre; J. S. Tripoli; R. G. Coalter

[57] ABSTRACT

In a signal expander, the envelope of an input signal to be expanded is detected and applied as a control signal to the gain control input of a variable gain device which expands the input signal. The control signal is applied to the variable gain device via an adaptive filter having improved ripple reduction and transient performance characteristics to minimize audibility of gain changes. The adaptive filter includes a low pass filter for producing a smoothed control signal essentially free of ripple and an analog gate for coupling the greater of the smoothed signal or a further signal to the variable gain device, the further signal being equal to the detector output signal less a constant. Compression of an input signal is provided by applying the input signal to the non-inverting input terminal of an amplifier and coupling the (compressed) output signal of the amplifier to its inverting input terminal via the expander.

4 Claims, 2 Drawing Figures

SIGNAL EXPANDER/COMPRESSOR WITH ADAPTIVE CONTROL CIRCUIT

This is a continuation-in-part of U.S. patent application Ser. No. 229,518 filed Jan. 29, 1981, and now abandoned.

This invention relates to signal expanders for restoring the dynamic range of compressed signals or increasing the effective dynamic range of uncompressed signals and to signal compressors for reducing the dynamic range of uncompressed signals.

It is known that one may preserve the dynamic range of an electric signal transmitted through a path or medium of relatively limited dynamic range by compressing the signal prior to transmission and then expanding the signal subsequent to transmission. Examples of audio noise reduction systems employing such as "companding" (i.e., compression-expansion) technique are U.S. Pat. No. 3,732,371 which issued May 8, 1973, to R. S. Burwen and U.S. Pat. No. 4,220,429 which issued to Talbot et al. Sept. 2, 1980.

It is also known that one may improve the apparent dynamic range of electrical signals by means of an expander even though the signals may be of uncompressed form. Examples of audio expanders for such "playback only" applications are given, for example, in the article "High-Fidelity Volume Expander" by N. C. Pickering in the September 1947 issue of AUDIO ENGINEERING magazine and U.S. Pat. No. 3,980,964 which issued Sept. 14, 1976 to R. M. Grodinsky.

A problem common to expanders (for either compressed or uncompressed signals) concerns avoidance of undesirable psychoacoustical effects commonly referred to as "pumping" or "breathing". This problem is particularly troublesome when the amplitude of the signal to be expanded suddenly changes, such as that occurring in a signal representative of a musical crescendo which produces a sudden surge in volume. In order to fully expand a crescendo or transient signal, it is customary to employ control circuits in the expander which quickly respond to transient signals but which respond more slowly for dynamically slowly changing signals. For this reason, expanders generally employ some form of adaptive or nonlinear filtering to vary the expansion characteristic under differing dynamic conditions of the signal to be expanded.

As an example, in the arrangement proposed by Talbot et al., the input signal to be expanded is applied to a detector which produces a control voltage which varies as a function of the input signal envelope. The control voltage is applied via the parallel combination of a diode and a first resistor to the control terminal of a gain control amplifier in the main signal path. The control terminal is also coupled to ground via a series connection of a second resistor and a capacitor.

Such an arrangement has a number of desirable features. For example, for large input signal transients, the diode becomes forward biased so that the control voltage is coupled essentially instantaneously to the amplifier control terminal, thereby enabling immediate expansion of the input signal by the amplifier. The capacitor, which normally smooths the control voltage, is prevented from becoming excessively charged for brief transients because of the presence of the second resistor. As a result, the gain of the amplifier quickly returns to its previous value subsequent to a brief transient signal condition. A further feature is that the capacitor and two resistors form a program level dependent release circuit. When the transient goes away and the detector output voltage drops, the diode becomes reverse biased and the capacitor discharges through the resistors to the current value of the program level.

Notwithstanding its advantages, there are three areas in which expanders employing adaptive filters of the type described above may be improved. These areas, discussed in detail subsequently, are: (1) control signal ripple reduction; (2) program level dependent release time; and (3) transient effects induced by rapid program level reduction. The expander of the present invention is directed to meeting the need for improvement in these three areas.

A signal expander, in accordance with the invention, includes input means for receiving an input signal to be expanded, detector means responsive to the input signal for producing an output signal having an amplitude which varies as a function of the envelope of the input signal and a variable gain means. The variable gain means has a first input coupled to receive the input signal, a second input for receiving an expansion control signal and an output for providing an expanded output signal. An adaptive filter means, responsive to the detector output signal, produces and supplies the expansion control signal to the second input of the variable gain means. The adaptive filter means comprises a low pass filter means including a capacitor and a current source means, the current source means being responsive to the output signal produced by the detector means for supplying charging current to the capacitor proportional to a potential difference, $V_1-V_2$, wherein $V_1$ is a voltage proportional to the detector output signal and $V_2$ is a voltage stored in the capacitor as a result of the charging thereof and independent of the instantaneous value of the charging current. The adaptive filter further includes analog gating means for coupling the greater of the second voltage, $V_2$, or a third voltage, $V_3$, to the second input of the gain control means, the voltage $V_3$ being equal to a potential difference $V_1-K$, wherein K is a constant.

The signal expander of the present invention may be used to impart a complementary compression characteristic to an input signal by applying the input signal to the non-inverting input terminal of an amplifier and coupling the (compressed) output signal produced by the amplifier to its inverting input terminal via the expander.

More specifically, a signal compressor embodying the invention includes amplifier means having a non-inverting input terminal for receiving an input signal to be compressed, an output terminal for providing a compressed output signal and an inverting input terminal for receiving a feedback signal provided via a feedback path coupled between the inverting input terminal and the output terminal of the amplifier. The feedback path includes a detector means responsive to the compressed output signal for producing a detected signal having an amplitude which varies as a function of the envelope of the compressed output signal. A variable gain means has a first input terminal coupled to receive the compressed output signal, a second input terminal for receiving a compression control signal and an output terminal for producing and supplying the feedback signal to the inverting input terminal of the amplifier means. An adaptive filter means, responsive to the detected signal, produces and supplies the compression control signal to the second input terminal of the variable gain means. The adaptive filter means comprises a low pass filter means including a capacitor and a current source means, the current source means being responsive to the detected signal produced by the detector means for supplying charging current to the capacitor proportional to a potential difference, $V_1-V_2$, wherein $V_1$ is a voltage proportional to the detected signal and $V_2$ is a voltage stored in the capacitor as a result of the charging thereof and independent of the instantaneous value of the charging current. An analog gating means couples the greater of the second voltage, $V_2$, or a third voltage, $V_3$, to the second input terminal of the variable gain means, the voltage $V_3$ being equal to a potential difference $V_1-K$, wherein K is a constant.

Figure 2:
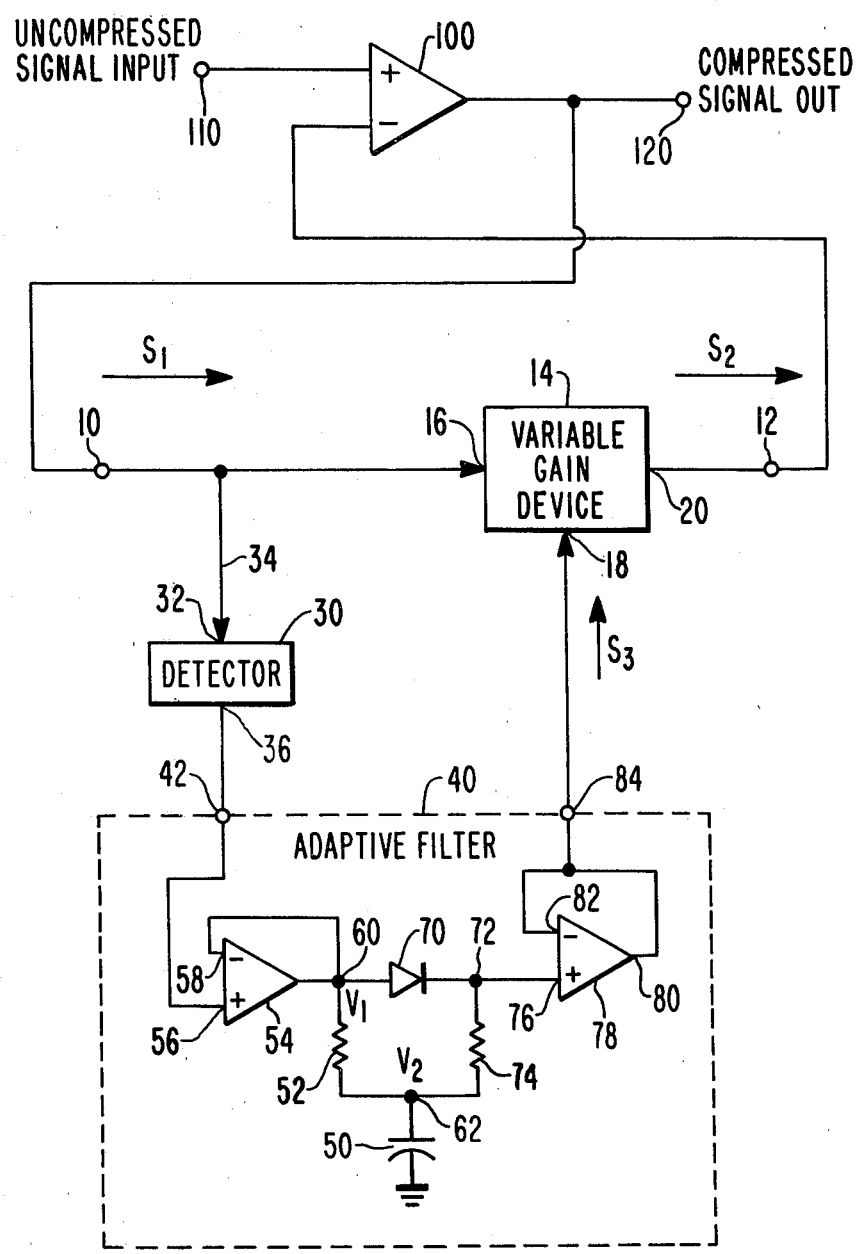

The invention is illustrated in the accompanying drawings wherein like elements are denoted by like reference designators and in which:

FIG. 1 is a block diagram, partially in schematic form, of a signal expander embodying the invention; and FIG. 2 is a block diagram, partially in schematic form, of a signal compressor embodying the invention.

The expander of FIG. 1 is a single band, single channel syllabic expander. It will readily be appreciated, as discussed subsequently, that the principles of the invention may be applied to multiband expanders and to multichannel (e.g., stereophonic or quadraphonic) expanders as well. Illustratively, it will be assumed that the signal to be expanded is an audio signal although signals in other frequency bands (e.g., infrasonic, supersonic, video, RF, etc.) may also be expanded by an appropriate selection of the expander design parameters (e.g., resistor values, capacitor values, diode types, detector and amplifier types, etc.) to conform to the desired input signal frequency band.

The expander comprises an input terminal 10 for receiving an input signal $S_1$ to be expanded and an output terminal 12 for providing an expanded output signal $S_2$. Input terminal 10 is coupled to output terminal 12 via a variable gain device 14 having a first input terminal 16 coupled to terminal 10 for receiving the signal $S_1$ to be expanded, a second input terminal 18 for receiving an expansion control signal $S_3$ and an output terminal 20 arranged to supply the expanded output signal $S_2$ to output terminal 12.

Variable gain device 14 may be of either the attenuating or the amplifying type, both being well known, and provides the function of controlling the level of the signal to be expanded in accordance with the value of the expansion control signal. Illustratively, an attenuating type of variable gain device may be constructed by coupling a resistor between terminals 16 and 20, coupling terminal 20 to a suitable source of reference potential (e.g., ground) via the conduction path of a field effect transistor and applying the control signal $S_3$ to the transistor gate electrode. Such a relatively simple variable gain device may exhibit a relatively limited gain or level control range. In expander applications where a relatively wide signal expansion range is desired, it is preferable that device 14 be of the controllable gain amplifier type such as, illustratively, an operational transconductance amplifier, or a precision analog signal multiplier. Such devices are well known, see generally the article "Linear ICs" by D. Ranada published in the Aug. 20, 1979 edition of the magazine EDN which provides a technical discussion of variable gain amplifiers.

The expansion control signal $S_3$ is produced, initially, by a detector 30 and coupled to the control terminal 18 of variable gain device 14 via an adaptive filter 40. Detector 30 has an input terminal 32 coupled to terminal 10 via a conductor 34 and an output terminal 36 coupled to the input terminal 42 of filter 40. Detector 30 provides the function of rectifying the input signal $S_1$ to produce an output signal at terminal 36 which varies as a function of the envelope or amplitude of the input signal $S_1$. For purposes of the present invention, the detector 30 may be of the average, peak or RMS responding type, all of which are well known.

Where the signal to be expanded is an audio frequency signal, it is desirable that detector 30 include a high pass filter in its input to reject low frequency noise components. A suitable cut off frequency would be on the order of 500 Hz or perhaps somewhat higher. In multiband expanders (e.g., expanders in which the signal is divided into several individual frequency bands) it is desirable that each detector include an input filter having a bandwidth corresponding to, or perhaps slightly less, than the frequency band of the variable gain device that it controls.

Adaptive filter 40 couples the output signal produced by detector 30 to the second input terminal 18 of variable gain device 14 and modifies the dynamic characteristics of the signal in several ways, so as to reduce the signal ripple content, reduce the transient signal recovery time and eliminate completely step changes in the signal induced by relatively small but rapid reductions in the input signal.

Filter 40 includes two principle elements, namely a low pass filter and an analog signal gating circuit. The low pass filter includes a capacitor 50 and a current source comprising a resistor 52 and a voltage follower amplifier 54. Amplifier 54 has a non-inverting input terminal 56 connected to adaptive filter input terminal 42 and an inverting input terminal 58 connected to a circuit node 60 and to the amplifier output terminal. As is known, a differential amplifier connected in such a manner exhibits essentially unity gain without inversion, a relatively high input impedance (thereby presenting substantially no load to the output of detector 30) and a very low output impedance (because of the essentially 100% negative feedback). Accordingly, the voltage $V_1$ at node 60 is substantially equal to the output voltage produced by detector 30 and independent of any loading effects of elements connected to node 60.

For audio signal expansion purposes, a relatively inexpensive operational amplifier suitable for use as amplifier 54 is the type 741 integrated internally compensated operational amplifier. Integrated circuits containing as many as four such amplifiers on one semiconductor die are also available and are preferred as the additional amplifiers may be used in the detector as precision rectifiers as well as in the filter (which uses two amplifiers). Advantages of using such "quad" operational amplifier integrated circuits include reduced cost, improved reliability (because of fewer interconnections needed) and minimization of circuit board space.

The remainder of the low pass filter portion of adaptive filter 40 comprises a node 62 which is coupled to node 60 via resistor 52 and to one plate of capacitor 50, the other plate of capacitor 50 being coupled to a source of reference potential (in this case, ground). Illustratively, for purposes of audio signal expansion, resistor 52 may have a value on the order of 200,000 Ohms and capacitor 50 may have a value on the order of about 10 microFarads, thereby resulting in a relatively long time constant of 2 seconds.

The analog signal gating portion of adaptive filter 40 comprises a diode 70 having an anode connected to node 60 and a cathode connected to a further node 72 which, in turn, is coupled to node 62 via a resistor 74 and to the non-inverting input terminal 76 of another operational amplifier 78 which also is connected as a voltage follower. In this case, however, the voltage follower connection of amplifier 78 is for the purpose of minimizing loading of node 72. Specifically, the input impedance at terminal 76 is much greater than the value of resistor 74 so that the time constant formed by resistor 74 and capacitor 50 is substantially unaffected by amplifier 78. A high input impedance for amplifier 78 is also desirable to prevent excessive current flow through diode 70 since the anode of diode 70 is connected to a low impedance node 60 and, when forward biased, diode 70 assumes a low impedance conductive state. For the assumed value of 10 microFarads for capacitor 50, a suitble value for resistor 74 would be on the order of 3000 Ohms, thereby providing a time constant of 30 milliseconds. The output terminal 80 of amplifier 78 is connected to its inverting input terminal (which causes voltage follower operation of the amplifier as previously mentioned) and to output terminal 84 of adaptive filter 40. Terminal 84 is coupled to the gain control input 18 of device 14 for supplying the expansion or gain control signal $S_3$ thereto.

Considering first only the operation of filter 40, the current source formed by amplifier 54 and resistor 52 supplies charging current to capacitor 50 proportional to the potential difference $V_1 - V_2$ between nodes 60 and 62. The voltage $V_1$ is proportional to the output voltage of detector 30 and is not influenced by the conductive state of diode 70 because the output impedance of amplifier 54 is very low compared to the values of resistors 52 and 74 and the input impedance of amplifier 78 is very high. The node 62 voltage $V_2$ equals the voltage stored on capacitor 50 as a result of the charging current supplied thereto and is independent of the instantaneous value of the charging current. This latter factor results because the voltage on a capacitor cannot be changed instantaneously and there are no intervening elements in the connection of capacitor 50 between node 62 and ground.

The analog gating circuit (70, 74, 78) couples the greater of the capacitor voltage $V_2$ or a third voltage $V_3$ to output terminal 84. The third voltage $V_3$ is equal to a potential difference $V_1 - K$, wherein K is a constant determined by the threshold or "turn-on" voltage of diode 70. The voltage $V_2$ is coupled to terminal 84 without any loss when diode 70 is non-conductive because the input impedance of amplifier 78 is very high so that substantially no current is conducted via resistor 74 in such a condition and therefore essentially no voltage drop appears across resistor 74. When $V_3$ exceeds $V_2$, diode 70 becomes conductive, resistor 74 supplies additional charging current to capacitor 50 and the output voltage will equal $V_3$ (i.e., $V_1 - K$) and will be independent of the voltage $V_2$ as long as $V_3$ is equal to or greater than $V_2$.

Overall operation of the expander and the interactive relationships of device 14, detector 30 and filter 40 is relatively complex but may be easily understood by considering a few specific examples of different dynamic conditions of the input signal $S_1$. First, assume that $S_1$ is a steady state signal or one having an amplitude which changes relatively slowly relative to the two second time constant of resistor 52 and capacitor 50. In this case, the voltage $V_2$ of capacitor 50 will very nearly equal $V_1$ and diode 70 will therefore be turned off. Any ripple voltage component which may be present in the output signal of detector 30 will thus be greatly attenuated by resistor 52 and capcitor 50 and so envelope ripple components will have substantially no effect on variable gain device 14. This results because even though the instantaneous charging current for capacitor 50 may include a ripple component, the voltage across capacitor 50 cannot change instantaneously and it is this voltage which is coupled to device 14 via the "analog OR gate" formed by elements 70, 74, and 78.

This feature of the invention represents a substantial advantage over the previously described adaptive filter in which the control voltage necessarily includes a ripple component under the same operating conditions. This results because the control signal is taken from the junction of the two resistors and not directly from the capacitor. Thus, in the previous adaptive filter, the control voltage equals the sum of the capacitor voltage plus the product of the value of the second resistor multiplied by the charging current. The magnitude of the ripple component of the control voltage is thus equal to the magnitude of the ripple component of the charging current times the value of the second resistor.

As a second example of the dynamic operation of the expander, assume that the signal to be expanded includes a very brief transient component which increases the signal level for a period of time substantially shorter than the time constant formed by resistor 74 and capacitor 50. In this case, the transient component of the control signal will be coupled directly through diode 70 to device 14 essentially bypassing the low pass filter and device 14 will expand the signal $S_1$ essentially instantaneously and will immediately return its previous gain level when the transient passes. Resistor 74, in this case, prevents capacitor 50 from receiving any significant charge for such brief transients. For longer transients, such as a moderately fast crescendo, resistor 74 does conduct sufficient current to capacitor 50 to enable the capacitor voltage to follow the longer transient so that as the crescendo ends the gain of device 14 does not abruptly decrease to its earlier value but decreases rather slowly because of discharge of capacitor 50 through resistor 52.

It is a further feature of the invention that the rate of return of the gain of device 14 to the original program level after a crescendo condition of moderate length is inherently faster than in the previously described adaptive filter assuming the same component values. The reason is that in the other filter the capacitor must discharge through two resistors whereas in the filter 40 capacitor 50 discharges through only a single resistor 52. Resistor 74 does not provide a discharge path for capacitor 50 because the input impedance of amplifier 78 is very high and under decrescendo conditions, diode 70 is reverse biased.

As a final example of the expander operation, assume that the input signal $S_1$ has been at a high level for a period of time such that $V_2$ is substantially equal to $V_1$ and then a very abrupt decrease in $S_1$ (and thus $V_1$) occurs. In this case (as in the previous case) capacitor 50 will discharge relatively slowly and smoothly through resistor 52 and the gain of device 14 will also slowly and smoothly decrease. In the previously described filter, for the same condition, there will be an immediate step function decrease in gain because the second resistor conducts discharge currents as well as charging currents for the capacitor. The amplitude of the step decrease will be proportional to the current conducted by the second resistor and if the control signal includes a ripple current component, that too will contribute to the control voltage in proportion to the value of the second resistor. Both of these problems are avoided in the adaptive filter 40 because resistor 74 conducts essentially no current in such a case.

In the signal compressor of FIG. 2, an operational amplifier 100 is connected at the non-inverting input terminal (+) thereof to a compressor input terminal 110 for receiving an input signal to be compressed and at the output terminal thereof to a compressor output terminal 120 for providing a compressed output signal. The output terminal of amplifier 100 is also coupled via a feedback path to its inverting input terminal (−). The feedback path comprises the signal expander of FIG. 1 wherein terminals 10 and 12 are connected to the amplifier 100 output and inverting input terminals, respectively.

In operation, the input signal to be compressed is applied to terminal 110, amplified by amplifier 100 and appears as a compressed output signal at terminal 120. Compression results because the gain of amplifier 100 is determined by the transfer function (i.e., the static and dynamic characteristics) of the expander in its feedback path. Since the expander gain increases with increasing signal level and the feedback is negative, the overall closed loop gain of amplifier 100 varies inversely with the input signal level and is thus complementary to the gain vs signal level characteristics of the expander. Accordingly, for both static and dynamic signal conditions, a signal encoded by the compressor of FIG. 2 and then decoded by the expander of FIG. 1 will be unaltered by the encoding-decoding (i.e., companding) process. Thus, one may perserve the dynamic range of an electrical signal transmitted through a path (e.g., wire line or radio link) or medium (e.g., disc or tape) of relatively limited dynamic range by first compressing the signal with the compressor of FIG. 2 prior to transmission and then expanding the signal by means of the expander of FIG. 1 subsequent to transmission.

Various changes may be made to the expander or the compressor of the present invention. For a multi-channel expander (or commpressor) system, for example (e.g., stereophonic or quadraphonic), each channel may be provided with a separate detector and variable gain device. Only a single adaptive filter would be needed, however, by appropriately combining the detector outputs and applying the filter output to the control terminal of each variable gain device. The amplifiers 54 and 78 may be replaced by other suitable devices (e.g., emitter followers) and may be readily adapted to provide voltage gain (or reduction) if desired in a specific application. Amplifier 54 may be eliminated entirely if the output impedance of detector 30 is relatively low as compared, for example, with the value of resistor 74. Amplifier 78 also may be eliminated if the input impedance of variable gain device 14 is relatively high so that it presents no significant loading effect at node 72. The reference potential to which the lower plate of capacitor 50 is connected is a matter of design choice, but, if other than ground level is used, it should be a substantially fixed voltage level so as not to introduce control signal variations unrelated to the signal being expanded.

What is claimed is:

1. A signal expander, comprising, in combination:
    input means for receiving an input signal to be expanded;
    detector means responsive to said input signal for producing an output signal having an amplitude which varies as a function of the envelope of said input signal;
    variable gain means having a first input terminal coupled to received said input signal, a second input terminal for receiving an expansion control signal and an output terminal for providing an expanded output signal; and
    adaptive filter means, responsive to the detector output signal, for producing and supplying said expansion control signal to said second input of said variable gain means, said adaptive filter means comprising:
    an input node coupled via a first circuit path to receive said detector output signal, an output node coupled via a second circuit path to said second input of said variable gain means and a common node for receiving a reference potential;
    first and second resistors connected in series, in the order named, between said input and output nodes;
    a capacitor connected without intervening elements between a common connection of said resistors and said common node; and
    a threshold conduction device having an input terminal connected solely to said input node and having an output terminal connected solely to said output node.

2. An expander as recited in claim 1 wherein said first and second circuit paths and said adaptive filter means exclude elements which would tend to be variably transmissive as a function of the time derivative of signals therein.

3. A signal expander as recited in claim 1 further comprising:
    amplifier means;
    an input terminal coupled to supply an input signal to be compressed to said amplifier means;
    an output terminal coupled to said amplifier means for providing an output signal; and
    means for applying said output signal of said amplifier means to said input means of said expander and for coupling said output terminal of said variable gain means to an input means of said amplifier means for forming a negative feedback path to cause said output signal of said amplifier means to be compressed.

4. An expander as recited in claim 1 wherein each of said first and second circuit paths includes a respective amplifier means for providing impedance transformation, the amplifier means of the first path having an output impedance substantially lower than the values of either of said first or second resistors, the input impedance of the amplifier means of the second path being substantially greater than the value of the second resistor.

* * * * *